United States Patent
Chen et al.

(10) Patent No.: US 9,831,272 B2
(45) Date of Patent: Nov. 28, 2017

(54) METAL OXIDE SEMICONDUCTOR CELL DEVICE ARCHITECTURE WITH MIXED DIFFUSION BREAK ISOLATION TRENCHES

(71) Applicant: QUALCOMM Incorporated, San Diego, CA (US)

(72) Inventors: Xiangdong Chen, San Diego, CA (US); Venugopal Boynapalli, San Marcos, CA (US); Satyanarayana Sahu, San Diego, CA (US); Hyeokjin Lim, San Diego, CA (US); Mukul Gupta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/264,560

(22) Filed: Sep. 13, 2016

(65) Prior Publication Data
US 2017/0287933 A1    Oct. 5, 2017

Related U.S. Application Data

(60) Provisional application No. 62/316,403, filed on Mar. 31, 2016.

(51) Int. Cl.
*H01L 27/118*    (2006.01)
*H01L 29/06*    (2006.01)

(52) U.S. Cl.
CPC .... *H01L 27/11807* (2013.01); *H01L 29/0642* (2013.01); *H01L 29/0649* (2013.01);
(Continued)

(58) Field of Classification Search
CPC . H01L 2027/11829; H01L 2027/11866; H01L 2027/11859; H01L 21/28518;
(Continued)

(56) References Cited

U.S. PATENT DOCUMENTS 7,535,063 B2    5/2009  Kao
8,759,872 B2    6/2014  Arghavani et al.
(Continued)

OTHER PUBLICATIONS

Partial International Search Report—PCT/US2017/019470—ISA/EPO—dated Jun. 7, 2017.
(Continued)

*Primary Examiner* — Shahed Ahmed
(74) *Attorney, Agent, or Firm* — Arent Fox, LLP

(57) ABSTRACT

A standard cell IC includes pMOS transistors in a pMOS region of a MOS device. The pMOS region extends between a first cell edge and a second cell edge opposite the first cell edge. The standard cell IC further includes nMOS transistors in an nMOS region of the MOS device. The nMOS region extends between the first cell edge and the second cell edge. The standard cell IC further includes at least one single diffusion break located in an interior region between the first cell edge and the second cell edge that extends across the pMOS region and the nMOS region to separate the pMOS region into pMOS subregions and the nMOS region into nMOS subregions. The standard cell IC includes a first double diffusion break portion at the first cell edge. The standard cell IC further includes a second double diffusion break portion at the second cell edge.

30 Claims, 6 Drawing Sheets

(52) U.S. Cl.
CPC ............... *H01L 2027/11829* (2013.01); *H01L 2027/11866* (2013.01)

(58) Field of Classification Search
CPC ............. H01L 29/401; H01L 29/41791; H01L 29/458; H01L 29/785; H01L 29/66795; H01L 29/0649
USPC .......................... 257/206, 401; 438/129, 599
See application file for complete search history.

(56) References Cited

U.S. PATENT DOCUMENTS

| | | | |
|---|---|---|---|
| 8,969,967 | B2 | 3/2015 | Noel et al. |
| 9,368,496 | B1 * | 6/2016 | Yu ....................... H01L 27/0886 |
| 2008/0176378 | A1 | 7/2008 | Batra et al. |
| 2013/0313615 | A1 * | 11/2013 | Tzeng ................ H01L 27/0207 257/206 |
| 2014/0353842 | A1 | 12/2014 | Yuan et al. |
| 2015/0054089 | A1 | 2/2015 | Hong et al. |
| 2015/0221639 | A1 | 8/2015 | Chen et al. |
| 2016/0013206 | A1 | 1/2016 | Vinet et al. |
| 2016/0056083 | A1 | 2/2016 | Do et al. |
| 2016/0071848 | A1 | 3/2016 | Sengupta et al. |
| 2016/0336183 | A1 * | 11/2016 | Yuan ................ H01L 21/28518 |

OTHER PUBLICATIONS

International Search Report and Written Opinion—PCT/US2017/019470—ISA/EPO—Sep. 22, 2017.

* cited by examiner

METAL OXIDE SEMICONDUCTOR CELL DEVICE ARCHITECTURE WITH MIXED DIFFUSION BREAK ISOLATION TRENCHES

CROSS-REFERENCE TO RELATED APPLICATION(S)

This application claims the benefit of U.S. Provisional Application Ser. No. 62/316,403, entitled "A METAL OXIDE SEMICONDUCTOR CELL DEVICE ARCHITECTURE WITH MIXED DIFFUSION BREAK ISOLATION TRENCHES" and filed on Mar. 31, 2016, which is expressly incorporated by reference herein in its entirety.

BACKGROUND

Field

The present disclosure relates generally to a standard cell architecture, and more particularly, to a metal oxide semiconductor (MOS) cell device architecture with mixed diffusion break isolation trenches.

Background

A standard cell device is an integrated circuit (IC) that implements digital logic.

An application-specific IC (ASIC), such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or a fin FETs (FinFETs)) and connect the transistors into circuits.

A diffusion break is a feature of a process technology that may be used to electrically isolate transistor regions within a standard cell device and/or to electrically isolate adjacent standard cell devices from each other. For example, a diffusion break may include a trench formed in the silicon substrate that isolates transistor regions within a standard cell device or isolates adjacent standard cell devices. However, conventional standard cell device architectures that include diffusion breaks often suffer from area penalties and/or standard cell device output penalties.

Accordingly, there is an unmet need for a diffusion break configuration that provides both efficient use of area and that has an improved standard cell device output.

SUMMARY

In an aspect of the disclosure, a standard cell device includes a plurality of p-type MOS (pMOS) transistors in a pMOS region of the standard cell device. The pMOS region extends between a first cell edge and a second cell edge opposite the first cell edge. The standard cell device further includes a plurality of n-type MOS (nMOS) transistors in an nMOS region of the standard cell device. The nMOS region extends between the first cell edge and the second cell edge. The standard cell device further includes at least one single diffusion break located in an interior region between the first cell edge and the second cell edge and extending across the pMOS region and the nMOS region to separate the pMOS region into pMOS subregions and the nMOS region into nMOS subregions. The standard cell device further includes a first double diffusion break portion extending at the first cell edge. The standard cell device further includes a second double diffusion break portion extending at the second cell edge.

DETAILED DESCRIPTION

Figure 1:
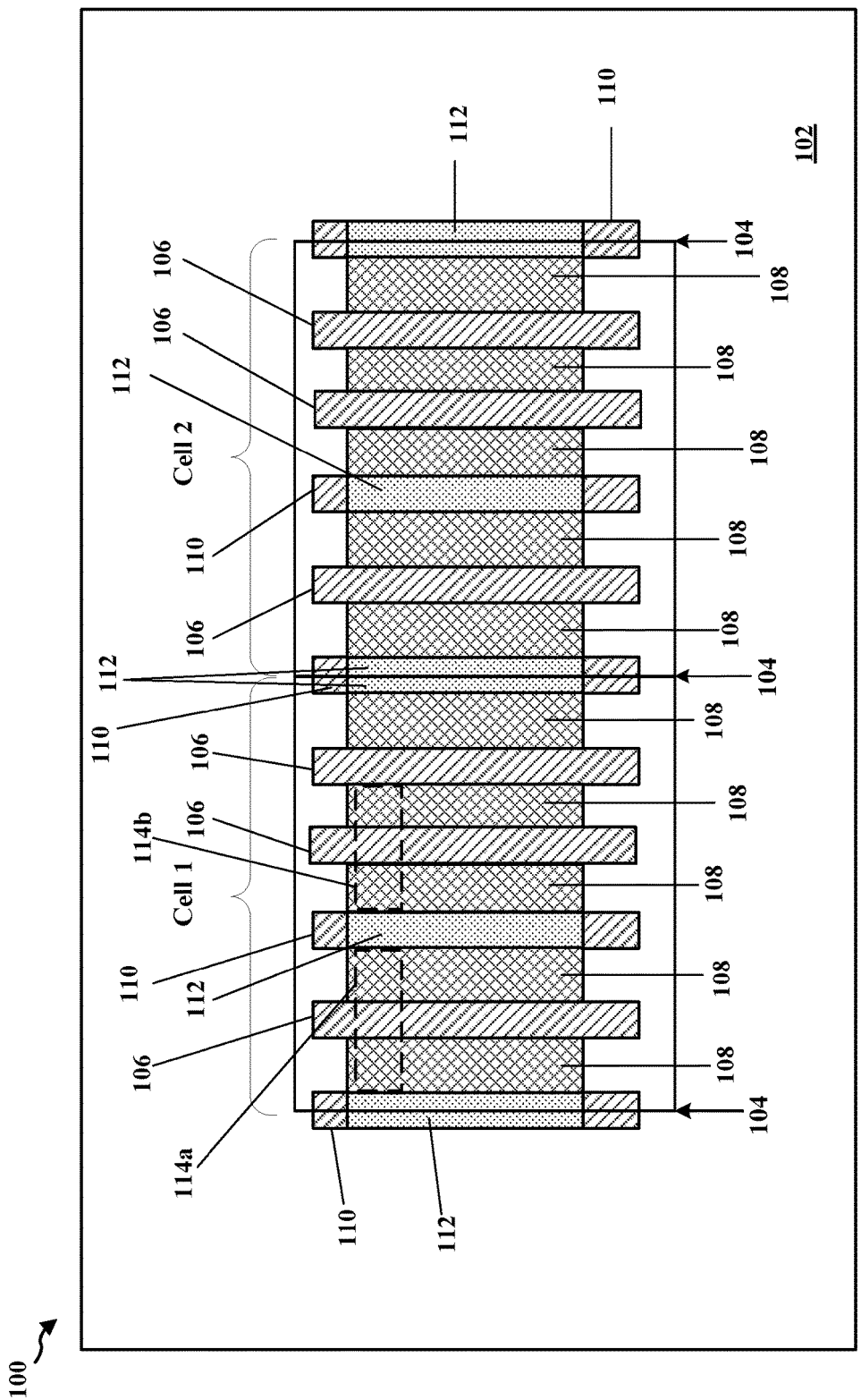
FIG. 1 is a diagram illustrating a plan view of a standard cell device architecture including single diffusion break isolation trenches.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

A diffusion break is a feature of process technology that may be used to electrically isolate transistor regions within a standard cell device and/or to electrically isolate adjacent standard cell devices. For example, a diffusion break may include a trench formed in the silicon substrate that isolates transistor regions within a standard cell device or adjacent standard cell devices. However, conventional standard cell device architectures that include diffusion breaks often suffer from area penalties and/or standard cell device output penalties.

One type of diffusion break that may be used in a standard cell architecture of the present disclosure is a single diffusion break. A single diffusion break may include an isolation trench formed in the silicon substrate to electrically isolate transistors within the standard cell device. In addition, a single diffusion break may include an isolation trench formed at a border between two standard cell devices to isolate adjacent standard cell devices electrically. A single diffusion break formed at a border between two standard cells may be located below a dummy gate interconnect or at a location where a dummy gate interconnect would be located at the border. A single diffusion break has the benefit of having a trench with a relatively shallow depth and narrow width that provides an efficient use of area within a standard cell device architecture. However, due to the relatively shallow depth and narrow width of the trench, the transistor can have poor performance or larger variation.

Another type of diffusion break that may be used in a standard cell architecture of the present disclosure is a double diffusion break (e.g., polysilicon on diffusion edge (PODE)). A double diffusion break may include an isolation trench formed between dummy gate interconnects located within a standard cell device. In addition, a double diffusion break may include an isolation trench formed at a border between two standard cell devices. In such a case, half of the double diffusion break is in a first standard cell between a first dummy gate interconnect in the first standard cell and an edge of the first standard cell, and a remaining half of the double diffusion break is in a second standard cell between a second dummy gate interconnect in the second standard cell and an edge of the second standard cell. A double diffusion break formed at a border between two standard cells may be located between dummy gate interconnects of the two standard cells. A double diffusion break has the benefit of having a trench that is deeper and wider than that of the single diffusion break. A double diffusion break provides efficient electrical isolation and increases standard cell device output. Due to the spacing required between adjacent standard cell devices for some semiconductor manufacturing process nodes, including a double diffusion break at the cell edge introduces only minimal area penalty (e.g., the width of the double diffusion break is only slightly wider than the required spacing between adjacent standard cell devices). However, using a double diffusion break within a standard cell device to separate transistors may cause an area penalty due to the increasingly smaller size of transistor spacing within a standard cell device. For example, using a double diffusion break within a cell may cause the standard cell to be larger than a standard cell using a single diffusion break within the standard cell.

FIG. 1 is a diagram illustrating a plan view of a standard cell device architecture 100 including single diffusion break isolation trenches according to an aspect of the present disclosure. The standard cell device architecture 100 of FIG. 1 illustrates a few of the design layers used to form the device on the substrate. Not all layers are illustrated. The design layers may be used to create masks for forming the device. The standard cell device architecture 100 illustrated in FIG. 1 includes multiple standard cell devices (e.g., Cell 1 and Cell 2) formed adjacent to one another on a silicon substrate 102. Each of the standard cells (Cell 1 and Cell 2) may implement one or more particular logic functions, such as AND, inverter, buffer, NAND, OR, NOR, etc., functionality. A cell edge 104 is located at a border between each of the standard cell devices. Although only two cells (e.g., Cell 1 and Cell 2) are illustrated in FIG. 1 for simplicity, it is understood that many more standard cell devices may be formed on the same silicon substrate 102 without departing from the scope of the present disclosure. For example, a standard cell device may be formed to the left of Cell 1 and a standard cell device may be formed to the right of Cell 2. In addition, standard cell devices may be formed above and below each of Cell 1 and Cell 2.

In the example embodiment illustrated in FIG. 1, each standard cell device includes transistors made of gate interconnects 106 and source/drain regions 108. The source/drain regions 108 may be referred to as diffusion (or active) regions. The diffusion regions 108 may be for planar transistors or for finFET transistors. The portions of the gate interconnects 106 adjacent to the source/drain regions 108 form gates of the transistors. To electrically isolate certain transistors within each standard cell device, a single diffusion break 112 may be formed along a dummy gate interconnect 110 (first process, see infra) or where the dummy gate interconnect 110 is indicated (second process, see infra). In addition, to electrically isolate Cell 1 and Cell 2, a single diffusion break 112 may be formed along a dummy gate interconnect 110 located at the cell edge 104 between Cell 1 and Cell 2 (first process, see infra) or where the dummy gate interconnect 110 is indicated (second process, see infra). There are at least two processes for forming the single diffusion break 112. In a first process, the single diffusion break 112 is formed before the dummy gate interconnect 110 is formed. In such a process, the dummy gate interconnect 110 remains above the single diffusion break 112. In a second process, the single diffusion break 112 is formed after the dummy gate interconnect 110 is formed. In such a process, the dummy gate interconnect 110 is etched away to form the single diffusion break 112, and therefore is not located above the single diffusion break 112.

For example, the single diffusion breaks 112 may include an isolation trench formed in the silicon substrate 102 and may be located along dummy gate interconnects 110 (first process) or along where the dummy gate interconnects 110 were located (second process) within the standard cell devices (e.g., Cell 1 and Cell 2) and/or at a cell edge 104 of the standard cell devices. In the second process, after the isolation trench is formed, a portion of the dummy gate interconnects 110 may remain at the outer edges of the standard cell device.

By using a single diffusion break 112, the standard cell device architecture 100 illustrated in FIG. 1 has the benefit of having an isolation trench with a relatively shallow depth and narrow width that provides an efficient use of area within standard cell devices. In particular, the single diffusion break 112 prevents an electrical connection between the two source/drain regions 114a, 114b abutting the single diffusion break 112 (e.g., substantially prevents current from flowing between the two source/drain regions). However, due to the relatively shallow depth and narrow width of the trench, silicon forming the source or drain on either side of the trench does not have the same degree of strain (i.e., worse strain characteristics) as other sources and drains of the cell and thus the sources/drains adjacent the trench have weaker drive strength for some process nodes. This may result in reduced standard cell device output (less output current for a given gate voltage as compared with a transistor where source/drain is not adjacent a single diffusion break).

Figure 2:
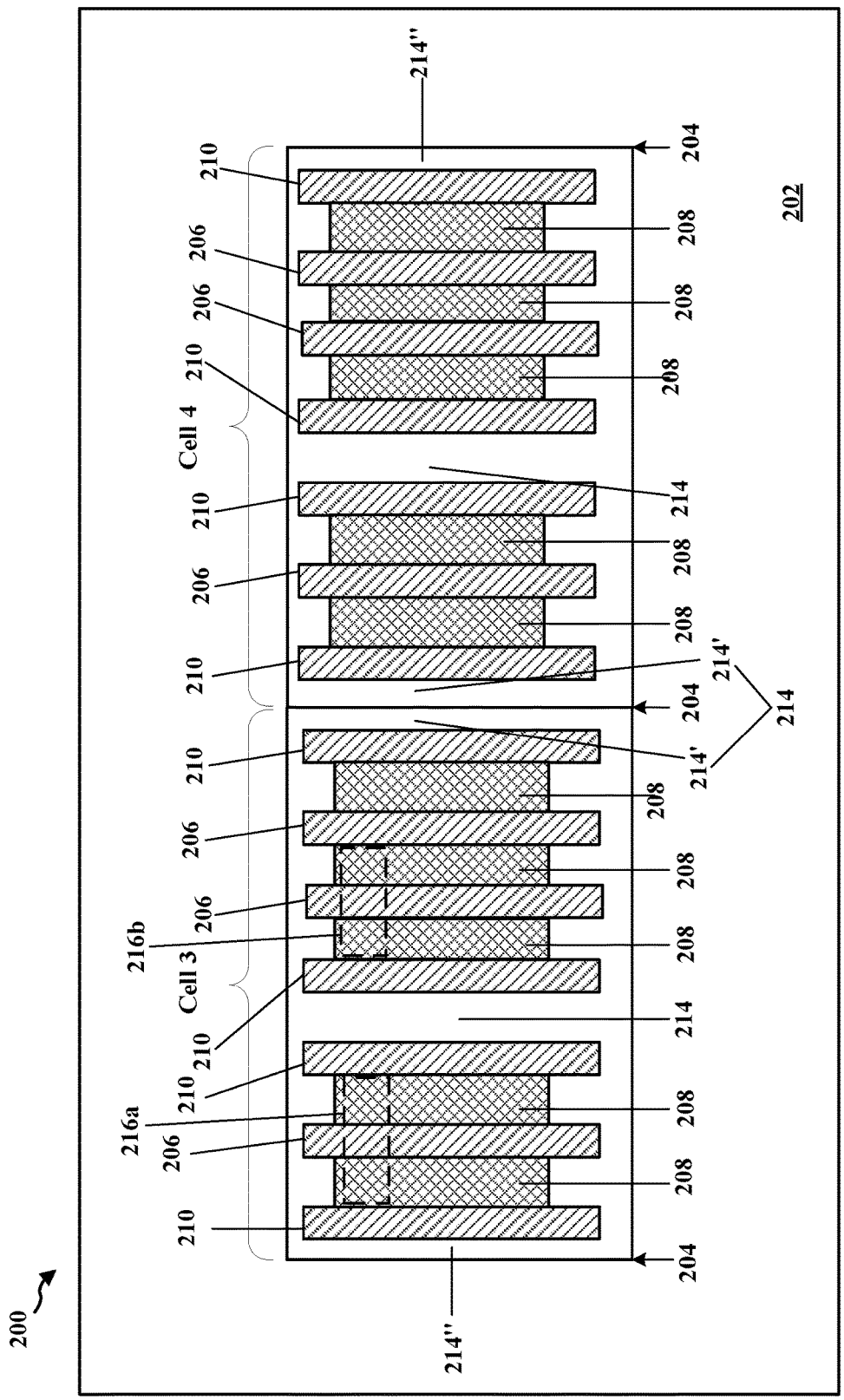
FIG. 2 is a diagram illustrating a plan view of a standard cell device architecture including double diffusion break isolation trenches.

FIG. 2 is a diagram illustrating a plan view of a standard cell device architecture 200 including double diffusion break isolation trenches in accordance with an aspect of the present disclosure. For example, the standard cell device architecture 200 illustrated in FIG. 2 includes multiple standard cell devices (e.g., Cell 3 and Cell 4) formed adjacent to one another on a silicon substrate 202. A cell edge 204 is located at a border between each of the standard cell devices. Although only two cells (e.g., Cell 3 and Cell 4) are illustrated in FIG. 2 for simplicity, it is understood that many more standard cell devices may be formed on the same silicon substrate 202 without departing from the scope of the present disclosure. For example, a standard cell device may be formed to the left of Cell 3 and a standard cell device may be formed to the right of Cell 4. In addition, standard cell devices may be formed above and below each of Cell 3 and Cell 4.

In the example embodiment illustrated in FIG. 2, each standard cell device includes transistors made of gate interconnects 206 and source/drain regions 208. For example, the portions of the gate interconnects 206 adjacent to the source/drain regions 208 form gates of the transistors. To electrically isolate certain transistors within each standard cell device, a double diffusion break 214 is formed between dummy gate interconnects 210 of adjacent transistors. In particular, the double diffusion break 214 prevents an electrical connection between the two source/drain regions 216a, 216b abutting the dummy gate interconnects 210 on either side of the double diffusion break 214 (e.g., substantially prevents current from flowing between the two source/drain regions). In an aspect, the dummy gate interconnects 210 may be formed from the same material as the gate interconnects 206, may be at the same elevation as the gate interconnects 206, may have the same pitch as the gate interconnects 206, may be formed by the same process as the gate interconnects 206, etc.

In addition, to electrically isolate Cell 3 and Cell 4, a double diffusion break 214 may be formed between dummy gate interconnects 210 on either side of the cell edge 204 between Cell 3 and Cell 4. The double diffusion break 214 includes a first half portion of the double diffusion break 214' in Cell 3 and a second half portion of the double diffusion break 214' in Cell 4. Additional double diffusion break portions 214" are illustrated at a left edge of Cell 3 and a right edge of Cell 4. The double diffusion breaks portions 214" isolate Cell 3 from a cell adjacent the left edge of Cell 3 and isolate Cell 4 from a cell adjacent the right edge of Cell 4.

The double diffusion breaks 214 may include an isolation trench formed in the silicon substrate 202 and located between dummy gate interconnects 210 within the standard cell devices (e.g., Cell 3 and Cell 4) and/or at a cell edge 204 of the standard cell devices.

The double diffusion breaks 214 illustrated in FIG. 2 have the benefit of having a trench that is deeper and wider than that of the single diffusion breaks 112 illustrated in FIG. 1. The double diffusion breaks 214 may provide more efficient electrical isolation and/or standard cell device output than by using a single diffusion break. In addition, due to the depth and width of the isolation trench of a double diffusion break 214, silicon forming the source/drain regions 216a, 216b on either side of the trench has better strain characteristics than the source/drain regions 114a, 114b abutting the single diffusion break 112 illustrated in FIG. 1. Thus, the source/drain regions 216a, 216b have an increased drive strength compared to source/drain regions adjacent a single diffusion break (e.g., source/drain regions 114a and 114b). However, due to the depth and width of the double diffusion break trench, by including double diffusion breaks 214 within a standard cell, the standard cell device architecture 200 illustrated in FIG. 2 is larger than the standard cell device architecture 100 illustrated in FIG. 1 even though the standard cell device architecture 200 implements the same function.

Figure 3A:
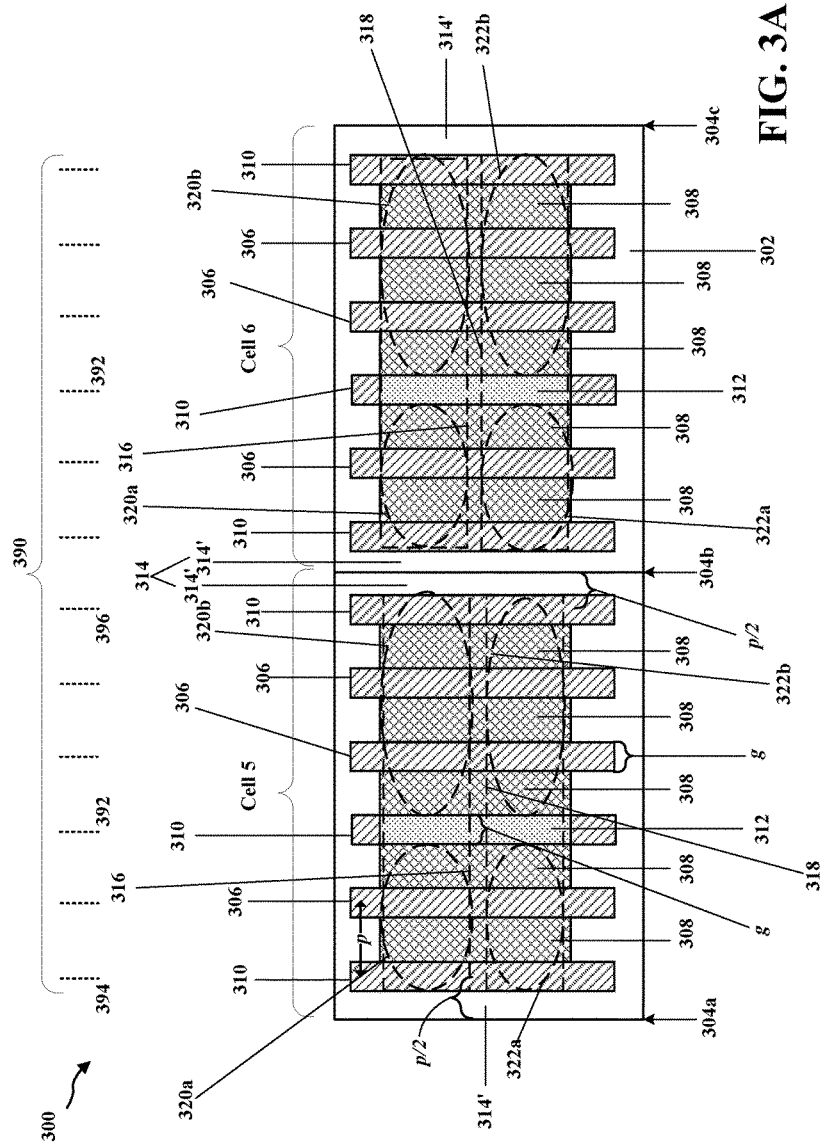
FIG. 3A is a diagram illustrating a plan view of an exemplary standard cell device architecture including mixed diffusion break isolation trenches.
Figure 3B:
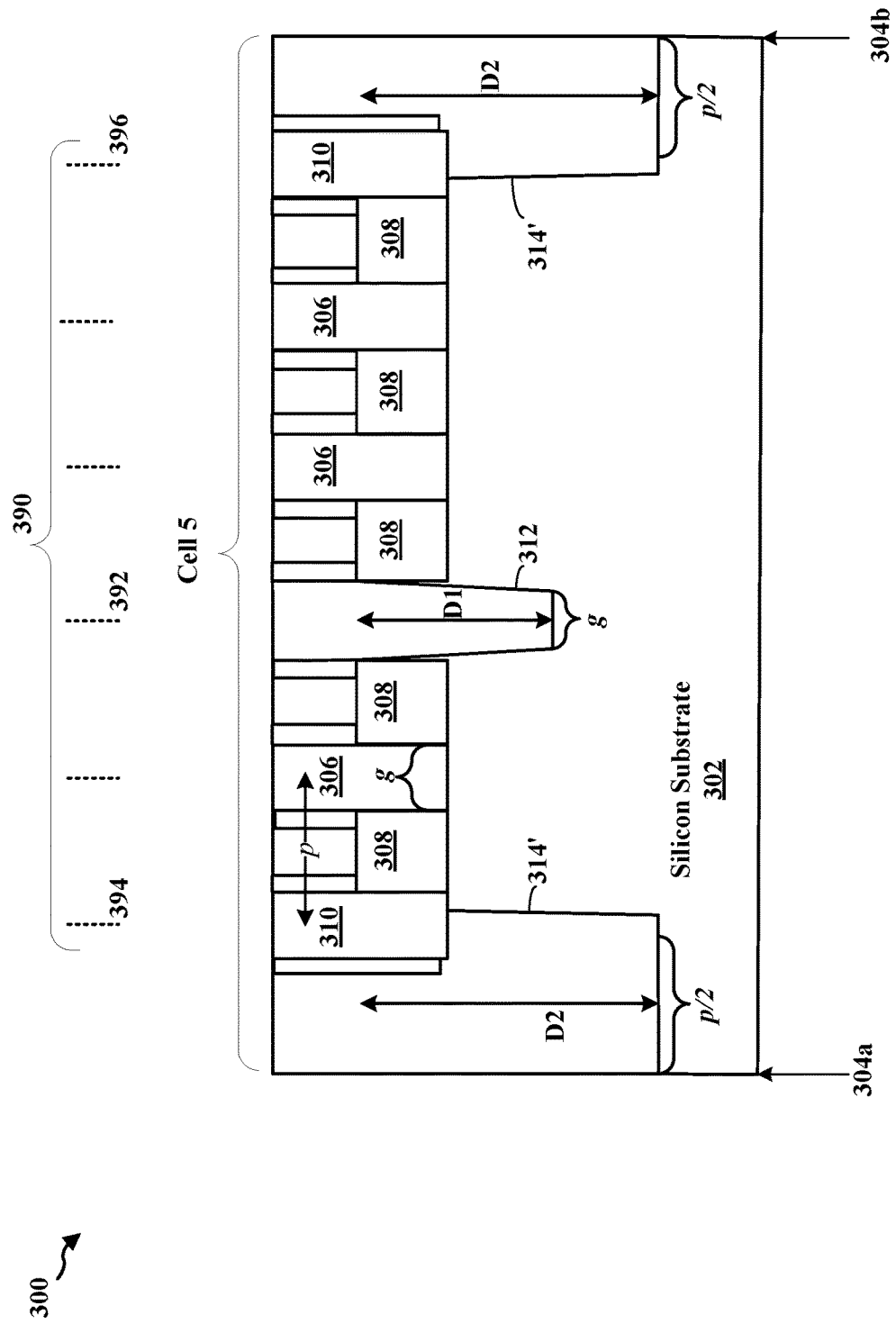
FIG. 3B is a diagram illustrating a cross-sectional view of the exemplary standard cell device architecture including mixed diffusion break isolation trenches illustrated in FIG. 3A.

Thus, to provide a standard cell device architecture that provides efficient use of area and efficient electrical isolation without significant reduction in standard cell device output, the present disclosure describes a standard cell device architecture that includes mixed diffusion break isolation trenches, as discussed infra with respect to FIGS. 3A and 3B.

FIG. 3A is a diagram illustrating an exemplary standard cell device architecture 300 including mixed diffusion break isolation trenches in accordance with an aspect of the present disclosure. The standard cell device architecture 300 of FIG. 3A illustrates a few design layers used to form the device on the substrate. Not all layers are illustrated. The design layers may be used to create masks for forming the device. The standard cell device architecture 300 illustrated in FIG. 3A includes multiple standard cell devices (e.g., Cell 5 and Cell 6) formed adjacent to one another on a silicon substrate 302. Each of the standard cells (Cell 5 and Cell 6) may implement one or more particular logic functions, such as AND, inverter, buffer, NAND, OR, NOR, etc., functionality. The standard cell device architecture 300 illustrated in FIG. 3A includes multiple standard cell devices (e.g., Cell 5 and Cell 6) formed adjacent to one another on a silicon substrate 302. A cell edge 304a, 304b, 304c is located at a boundary of each standard cell device. Although only two standard cell devices (e.g., Cell 5 and Cell 6) are illustrated in FIG. 3A for simplicity, it is understood that many more standard cell devices may be formed on the same silicon substrate 302 without departing from the scope of the present disclosure. For example, a standard cell device may be formed to the left of Cell 5 and a standard cell device may be formed to the right of Cell 6. In addition, standard cell devices may be formed above and below each of Cell 5 and Cell 6.

In the example embodiment illustrated in FIG. 3A, each standard cell device may include a pMOS region 316 including pMOS transistors and an nMOS region 318 including nMOS transistors. The pMOS region 316 and the nMOS region 318 of Cell 5 may extend from adjacent the cell edge 304a to adjacent the cell edge 304b, and specifically between the dummy gate interconnects 310 of Cell 5. The pMOS region 316 and the nMOS region 318 of Cell 6 may extend from adjacent the cell edge 304b to adjacent the cell edge 304c, and specifically between the dummy gate interconnects 310 of Cell 6. The pMOS transistors and the nMOS transistors may be made up of gate interconnects 306 (e.g., each gate interconnect 306 being formed along one of n grids 390) and source/drain regions 308. The source/drain regions 108 may be referred to as diffusion (or active) regions. The diffusion regions 108 may be for planar transistors or for finFET transistors. The portions of the gate interconnects 306 adjacent to the source/drain regions 308 form gates of the pMOS transistors and the nMOS transistors. In the example illustrated in FIG. 3A, there are 6 grids 390 for each cell. The gate interconnects 306 and/or n grids 390 may extend across the pMOS region 316 and the nMOS region 318. In the example illustrated in FIG. 3A, each gate interconnect 306 is separated by pitch p and each standard cell device has a width of approximately n*p. In one example embodiment, each gate interconnect 306 may have a width g.

To electrically isolate and/or separate the pMOS region 316 into pMOS subregions 320a, 320b and the nMOS region 318 into nMOS subregions 322a, 322b, and provide an efficient use of space within the standard cell device, a single diffusion break 312 may be formed along one of the n grids 392 (e.g., dummy gate interconnect 310 (first process) or where the dummy gate interconnect 310 is indicated (second process)) located in an interior region of each of the standard cell devices. In one aspect, the single diffusion break 312 may have a width of approximately g. In other words, the width of the single diffusion break 312 may be approximately the width of a gate interconnect 306. In one aspect, the single diffusion break 312 may include an isolation trench formed in the silicon substrate 302 along one of the n grids 392. The single diffusion break 312 may be located under the dummy gate interconnect 310 (first process) or where the dummy gate interconnect 310 is indicated (second process).

In addition, to electrically isolate Cell 5 and Cell 6 and to provide improved device output drive strength without incurring any significant area penalty, one half of a double diffusion break 314' (also referred to as a double diffusion break portion) may be formed along each cell edge between Cell 5 and Cell 6. The two halves of the double diffusion break 314' together are a full double diffusion break 314. Due to the spacing required between adjacent standard cell devices, including a double diffusion break may introduce minimal and/or insignificant area penalty while providing improved standard cell device output performance.

Referring again to FIG. 3A, Cell 5 includes a first double diffusion break portion 314' that includes an isolation trench formed in the silicon substrate 302 extending along a first cell edge 304a between the first cell edge 304a and a first grid 394 (e.g., center of dummy gate interconnect 310) located approximately p/2 from the first cell edge 304a. In addition, Cell 5 includes a second double diffusion break portion 314' with an isolation trench formed in the silicon substrate 302 that extends along a second cell edge 304b between the second cell edge 304b and a second grid 396 (e.g., center of dummy gate interconnect 310) located approximately p/2 from the second cell edge 304b. In an example embodiment, Cell 6 may include the same or similar double diffusion breaks as described supra with respect to Cell 5.

The isolation trench of the single diffusion breaks 312 may be shallower and narrower (e.g., with a width of approximately g) than the isolation trench of the double diffusion breaks 314 (e.g., as illustrated in FIG. 3B), thus providing efficient use of area within each standard cell device. Conversely, the isolation trench of the double diffusion breaks 314 may be formed deeper and wider (e.g., with a width of approximately p) than the isolation trench of the single diffusion breaks 312, thus providing efficient standard cell device output without a significant area penalty due to similar spacing requirements between adjacent standard cell devices. For example, p may be greater than g.

By using mixed diffusion break isolation trenches, the standard cell device architecture 300 illustrated in FIG. 3A may have improved area utilization (e.g., most of the cell area penalty at cell edge 304 caused by the double diffusion break 314 may be compensated by utilization improvement) as a result of the use of the internal single diffusion breaks. In addition, if the output node of the standard cell is at an edge of the standard cell, the standard cell device architecture 300 also provides a good standard cell device output drive strength as a result of the double diffusion breaks at the edges of the standard cell.

FIG. 3B is a diagram illustrating a cross-sectional view of the exemplary standard cell device architecture 300 including mixed diffusion break isolation trenches illustrated in FIG. 3A. For simplicity, only the standard cell device architecture for Cell 5 is illustrated in FIG. 3B. In addition, the details illustrated in FIG. 3B are not drawn to scale.

In the example embodiment illustrated in FIG. 3B, the standard cell device includes transistors made up of gate interconnects 306 (e.g., each formed along one of n grids 390) and source/drain regions 308. The source/drain regions 308 are illustrated as rectangular in FIG. 3B and located on a surface of the silicon substrate 302 (as the source/drain regions 308 may be fins of FinFETs), but may in practice be trapezoids in cross-section or other shapes and may be embedded in the silicon substrate 302 (such as with planar transistors). In the example illustrated in FIG. 3B, each gate interconnect 306 is separated by pitch p and the standard cell device has a width of approximately n*p. In one aspect, the gate interconnects 306 may have a width g.

To electrically isolate and/or separate certain transistors within the standard cell device and to provide an efficient use of space, a single diffusion break 312 may be formed along one of the n grids 392 located in an interior region of the standard cell device. In one aspect, the single diffusion break 312 may have a width of approximately g. In other words, the width of the single diffusion break 312 may be approximately the width of a gate interconnect 306. In one aspect, the single diffusion break 312 may include a trench formed through a shallow trench isolation (STI) process (such trench referred to as an STI herein) formed to depth D1 in the silicon substrate 302. There are at least two processes for forming the single diffusion break 312. In a first process, the single diffusion break 312 is formed before the dummy gate interconnect 310 is formed. In such a process, the dummy gate interconnect 310 remains above the single diffusion break 312 (not illustrated in FIG. 3B). In a second process, the single diffusion break 312 is formed after the dummy gate interconnect 310 is formed (illustrated in FIG. 3B). In such a process, the dummy gate interconnect 310 is etched away to form the single diffusion break 312, and therefore is not located above the single diffusion break 312.

To electrically isolate Cell 5 from adjacent standard cell devices (e.g., Cell 5 and Cell 6), and to provide efficient standard cell device output, a double diffusion break portion 314' may be formed at the cell edges 304a, 304b. For example, Cell 5 includes a first double diffusion break portion 314' (e.g., one half of a full double diffusion break) with an STI formed to depth D2 in the silicon substrate 302. Alternatively, the trench formed to depth D2 may be formed through a deep trench isolation (DTI) process (such trench referred to as a DTI herein). The first double diffusion break portion 314' extends along a first cell edge 304a between the first cell edge 304a and a first grid 394 (e.g., center of dummy gate interconnect 310) located approximately p/2 from the first cell edge 304a. In addition, Cell 5 includes a second double diffusion break portion 314' with an STI (or alternatively DTI) formed to depth D2 in the silicon substrate 302. The second double diffusion break portion 314' (e.g., one half of a full double diffusion break) extends along a second cell edge 304b between the second cell edge 304b and a second grid 396 (e.g., center of dummy gate interconnect 310) located approximately p/2 from the second cell edge 304b.

In an example embodiment, the width of each full double diffusion break may be greater than the width of the single diffusion break 312 (e.g., p is greater than g). In addition, the depth of the isolation trenches of each of the double diffusion break portions 314' may be greater than the depth of the isolation trench of the single diffusion break 312 (e.g., D2 is greater than D1).

The isolation trench of the single diffusion break 312 may be formed shallower (e.g., D1) and narrower (e.g., g) than the isolation trench of the full double diffusion breaks, thus providing efficient use of area within each standard cell device. Conversely, the isolation trench of the full double diffusion breaks may be formed deeper (e.g., D2) and wider (e.g., p) than the isolation trench of the single diffusion break 312, thus providing efficient standard cell device output without a significant area penalty due to similar spacing requirements for adjacent standard cell devices.

By using mixed diffusion break isolation trenches, the standard cell device architecture 300 illustrated in FIG. 3B may provide improved area utilization (e.g., most of the cell area penalty at cell edge 304a, 304b caused by the double diffusion break 314 may be compensated by utilization improvement).

Figure 4:
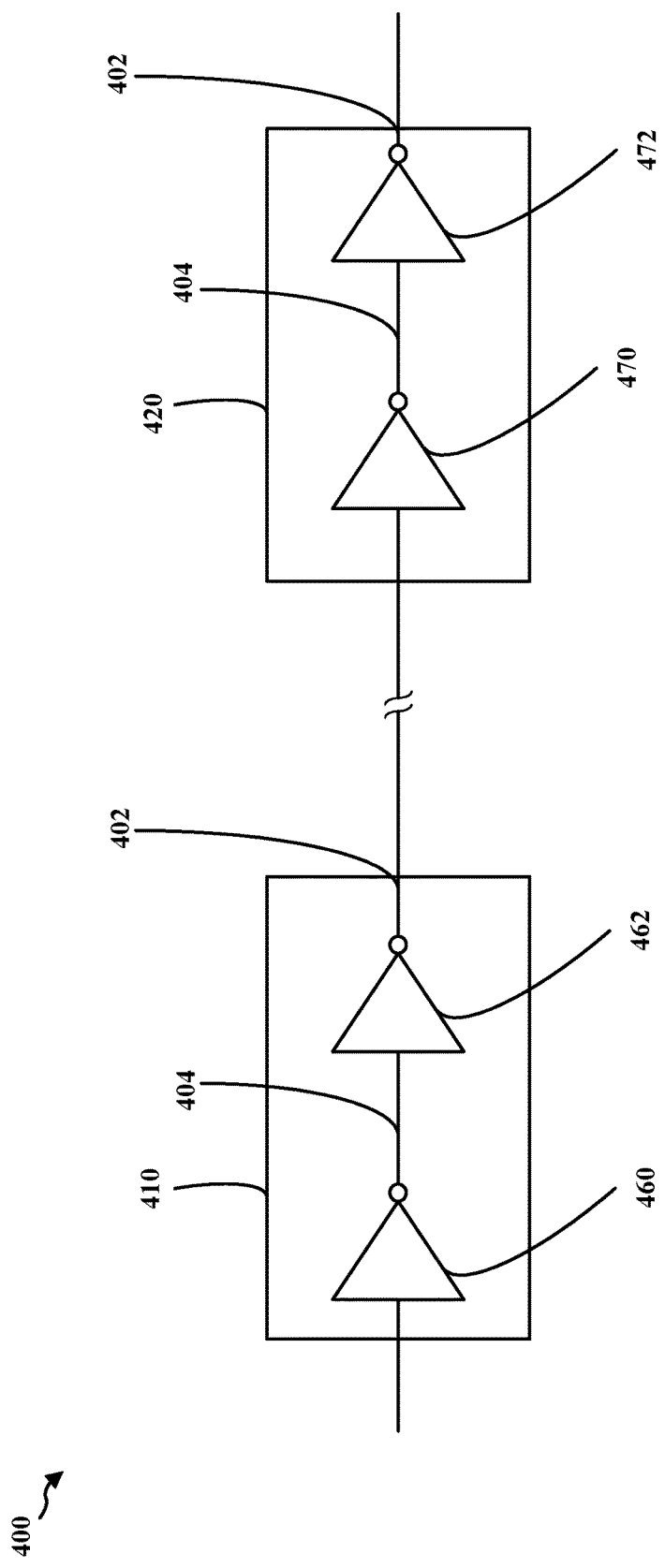
FIG. 4 is a diagram illustrating connected standard cells, each including buffer functionality.

FIG. 4 is a diagram 400 illustrating connected standard cells 410, 420, each including buffer functionality. In prior processing nodes (semiconductor device fabrication nodes), utilizing a single diffusion break for isolating diffusion regions was adequate and did not affect the strain of the source/drain regions enough to make a big difference in the output drive strength of the transistors formed adjacent to the single diffusion break. In the next processing node (with relatively smaller width and spacing), there was significant degradation of strain and thus a degradation of output drive strength due to the single diffusion break.

Consequently, double diffusion breaks are used to preserve adequate output drive strength. In the present disclosure, rather than using double diffusion breaks to isolate each diffusion region, single diffusion breaks 312 are implemented adjacent source/drain regions of transistors that drive internal nodes 404 (e.g., the internal node 404 between the inverter 460 and the inverter 462, or the internal node 404 between the inverter 470 and the inverter 472) of the standard cell (e.g., not output nodes 402 of the standard cell; internal nodes 404 tend to be located in an interior region of a standard cell) and double diffusion breaks 314 are implemented adjacent source/drain regions of transistors that drive output nodes 402 of the standard cell (e.g., nodes connected to wiring that connects the output of one cell to the input of another; output nodes 402 tend to be located at exterior regions of a standard cell). The degraded performance of a single diffusion break 312 is acceptable for internal nodes 404 (because they drive a small capacitance) in exchange for reduced footprint or area usage. For output nodes 402 of the standard cell, the present disclosure discloses using the double diffusion breaks 314', 314 at the edges/exterior regions of the cell to ensure adequate drive strength. An output node 402 needs more drive strength than an internal node 404 because the output node 402 will have much more capacitance due to the various portions of metal and vias that connect the output of the cell to the input of another cell. In contrast, an internal node 404 might include far less metal and far fewer vias because the internal node 404 connects the source/drain of a transistor of the cell (e.g., the source/drain abutting the single diffusion break) to a gate of another transistor nearby in the same cell. In the present disclosure, single diffusion breaks are used for internal nodes 404 while double diffusion breaks are used at edges/external regions of the standard cell (where output nodes 402 are likely to be located), which thereby reduced the area of the cell as compared to a version of the cell using only double diffusion breaks.

Figure 5:
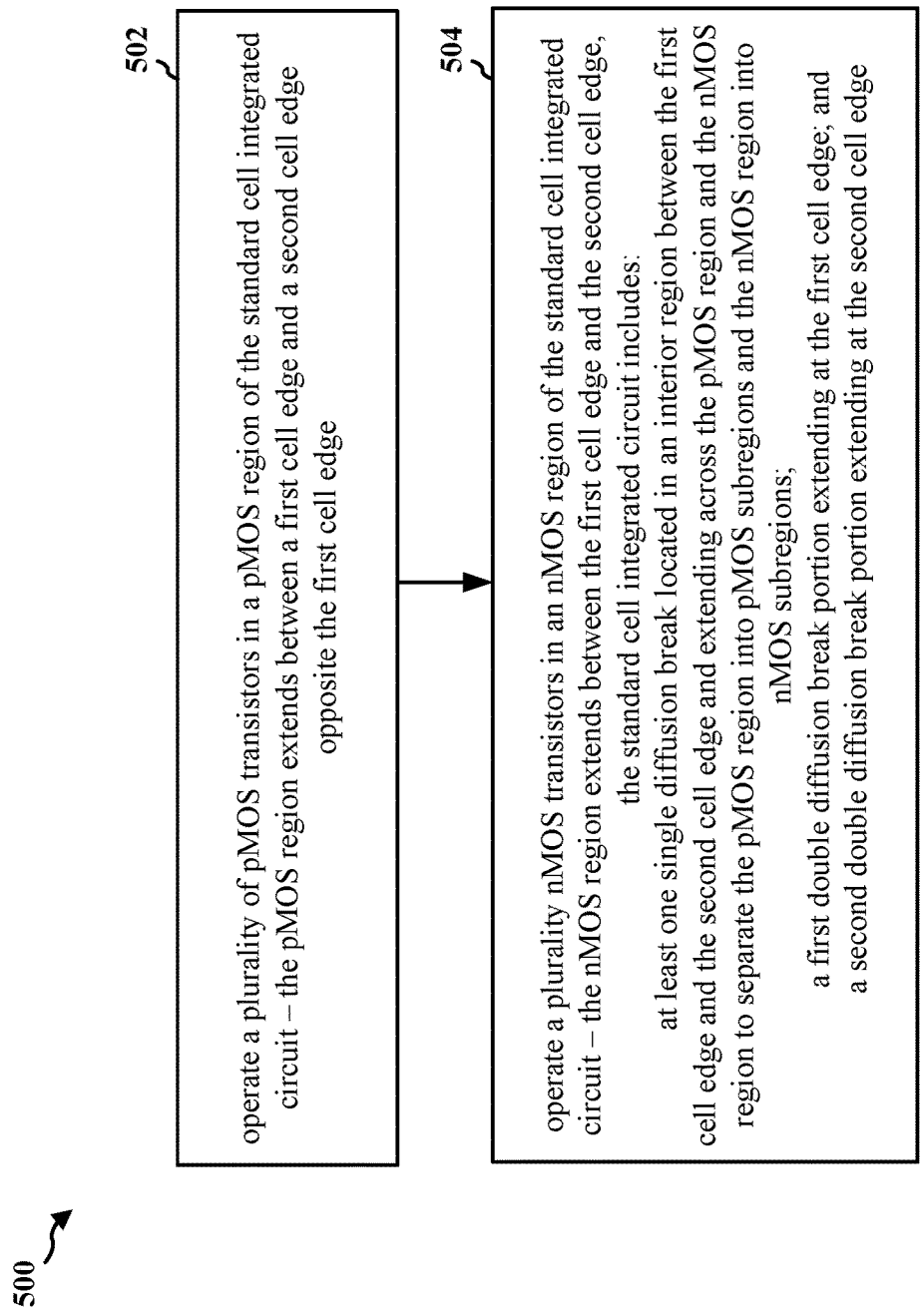
FIG. 5 is a diagram illustrating a method of operation of a standard cell integrated circuit.

FIG. 5 is a diagram 500 illustrating a method of operation of a standard cell integrated circuit. At 502, a plurality of pMOS transistors are operated in a pMOS region 316 of the standard cell integrated circuit (e.g., Cell 5 of FIG. 3A). The pMOS region 316 extends between a first cell edge 304a and a second cell edge 304b opposite the first cell edge 304a. At 504, a plurality of nMOS transistors are operated in an nMOS region 318 of the standard cell integrated circuit. The nMOS region 318 extends between the first cell edge 304a and the second cell edge 304b. The standard cell integrated circuit includes at least one single diffusion break 312 located in an interior region between the first cell edge 304a and the second cell edge 304b and extending across the pMOS region 316 and the nMOS region 318 to separate the pMOS region 316 into pMOS subregions 320a, 320b and the nMOS region 318 into nMOS subregions 322a, 322b. The standard cell integrated circuit further includes a first double diffusion break portion 314' extending at the first cell edge 304a. The standard cell integrated circuit further includes a second double diffusion break portion 314' extending at the second cell edge 304b.

In one configuration, the standard cell integrated circuit has n grids 390 with pitch p between the grids 390, and a width of approximately n*p. The grids 390 extend across the pMOS region 316 and the nMOS region 318. In addition, in such configuration, each of the at least one single diffusion break 312 extends along a different one (392) of the n grids 390 located in the interior region. In addition, the first double diffusion break portion 314' extends along the first cell edge 314a between the first cell edge 304a and a first grid 394 located approximately p/2 from the first cell edge 304a. Further, the second double diffusion break portion 314' extends along the second cell edge 304b between the second cell edge 304b and a second grid 396 located approximately p/2 from the second cell edge 304b.

In one configuration, gate interconnects 306 for the pMOS transistors and the nMOS transistors extend along a subset of the n grids 390.

In one configuration, the gate interconnects 306 have a width g, each of the at least one single diffusion break 312 has a width of approximately g, and each of the first double diffusion break portion 314' and the second double diffusion break portion 314' has a width of approximately p/2, where p is greater than g.

In one configuration, each of the at least one single diffusion break 312, the first double diffusion break portion 314', and the second double diffusion break portion 314' comprises an STI region. In another configuration, the single diffusion breaks 312 comprise STI regions and the double diffusion breaks 314 comprise DTI regions.

In one configuration, a depth of each STI region of the first double diffusion break portion 314' and the second double diffusion break portion 314' is greater than a depth of each STI region of the at least one single diffusion break 312.

In one configuration, each of the first double diffusion break portion 314' and the second double diffusion break portion 314' is approximately half of a full double diffusion break 314.

In one configuration, the plurality of pMOS transistors include a first subset of pMOS transistors and a second subset of pMOS transistors, and the plurality of nMOS transistors include a first subset of nMOS transistors and a second subset of nMOS transistors. The first subset of pMOS transistors and the first subset of nMOS transistors provide first logic functionality (e.g., the inverter 460 or the inverter 470). The second subset of pMOS transistors and the second subset of nMOS transistors provide second logic functionality (e.g., the inverter 462 or the inverter 472). The first functionality and the second functionality are separated by an internal node 404. One single diffusion break of the at the least one single diffusion break 312 isolates diffusion regions for the first logic functionality and the second logic functionality at the internal node 404. In one configuration, the first logic functionality (e.g., the inverter 460 or the inverter 470) outputs to the second logic functionality (e.g., the inverter 462 or the inverter 472). In addition, the second logic functionality (e.g., the inverter 462 or the inverter 472) has an output node 402. Further, the output node 402 is adjacent one of the first cell edge 304a or the second cell edge 304b.

In one configuration, a standard cell integrated circuit includes a plurality of pMOS transistors in a pMOS region 316 of the standard cell integrated circuit. The pMOS region 316 extends between a first cell edge 304a and a second cell edge 304b opposite the first cell edge 304a. The standard cell integrated circuit further includes a plurality of nMOS transistors in an nMOS region 318 of the standard cell integrated circuit. The nMOS region 318 extends between the first cell edge 304a and the second cell edge 304b. The standard cell integrated circuit further includes a first means for isolating diffusion regions 312 located in an interior region between the first cell edge 304a and the second cell edge 304b and extending across the pMOS region 316 and the nMOS region 318. The first means for isolating diffusion regions 312 is configured to separate the pMOS region 316 into pMOS subregions 320a, 320b and the nMOS region 318 into nMOS subregions 322a, 322b. A width of the first means for isolating diffusion regions 312 is approximately g. The standard cell integrated circuit further includes a second means for isolating diffusion regions 314' extending at the first cell edge 304a. A width of the second means for isolating diffusion regions 314' is approximately p/2, where p is greater than g. The standard cell integrated circuit further includes a third means for isolating diffusion regions 314' extending at the second cell edge 304b. A width of the third means for isolating diffusion regions 314' is approximately p/2. In one configuration, the first means for isolating diffusion regions 312 is at least one single diffusion break located in the interior region between the first cell edge 304a and the second cell edge 304b and extending across the pMOS region 316 and the nMOS region 318 to separate the pMOS region 316 into the pMOS subregions 320a, 320b and the nMOS region 318 into the nMOS subregions 322a, 322b. In addition, the second means for isolating diffusion regions 314' is a first double diffusion break portion extending at the first cell edge 304a. Further, the third means for isolating diffusion regions 314' is a second double diffusion break portion extending at the second cell edge 304b.

In one configuration, a standard cell integrated circuit includes a plurality of pMOS transistors in a pMOS region 316 of the standard cell integrated circuit. The pMOS region 316 extends between a first cell edge 304a and a second cell edge 304b opposite the first cell edge 304a. In addition, the standard cell integrated circuit includes a plurality of nMOS transistors in an nMOS region 318 of the standard cell integrated circuit. The nMOS region 318 extends between the first cell edge 304a and the second cell edge 304b. In addition, the standard cell integrated circuit includes means for providing at least one diffusion break 312 located in an interior region between the first cell edge 304a and the second cell edge 304b and extending across the pMOS region 316 and the nMOS region 318 to separate the pMOS region 316 into pMOS subregions 320a, 320b and the nMOS region 318 into nMOS subregions 322a, 322b. In addition, the standard cell integrated circuit includes means for providing a first diffusion break portion 314' extending at the first cell edge 304a. The means for providing the first diffusion break portion 314' has a greater depth than the means for providing the at least one diffusion break 312. Further, the standard cell integrated circuit includes means for providing a second diffusion break portion 314' extending at the second cell edge 304b. The means for providing the second diffusion break portion 314' has a greater depth than the means for providing the at least one diffusion break 312. In one configuration, the means for providing the at least one diffusion break 312 comprises at least one single diffusion break, the means for providing the first diffusion break portion 314' comprises a first double diffusion break portion, and the means for providing the second diffusion break portion 314' comprises a second double diffusion break portion.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A standard cell integrated circuit, comprising:
    a plurality of p-type metal oxide semiconductor (MOS) (pMOS) transistors in a pMOS region of the standard cell integrated circuit, the pMOS region extending between a first cell edge and a second cell edge opposite the first cell edge;
    a plurality of n-type MOS (nMOS) transistors in an nMOS region of the standard cell integrated circuit, the nMOS region extending between the first cell edge and the second cell edge;
    at least one single diffusion break located in an interior region between the first cell edge and the second cell edge and extending across the pMOS region and the nMOS region to separate the pMOS region into pMOS subregions and the nMOS region into nMOS subregions;
    a first double diffusion break portion extending at the first cell edge; and
    a second double diffusion break portion extending at the second cell edge.

2. The standard cell integrated circuit of claim 1, wherein the standard cell integrated circuit has n grids with pitch p between the grids, and a width of approximately n*p, the grids extending across the pMOS region and the nMOS region, and wherein:
    each of the at least one single diffusion break extends along a different one of the n grids located in the interior region, the first double diffusion break portion extends along the first cell edge between the first cell edge and a first grid located approximately p/2 from the first cell edge, and the second double diffusion break portion extends along the second cell edge between the second cell edge and a second grid located approximately p/2 from the second cell edge.

3. The standard cell integrated circuit of claim 2, wherein gate interconnects for the pMOS transistors and the nMOS transistors extend along a subset of the n grids.

4. The standard cell integrated circuit of claim 3, wherein the gate interconnects have a width g, each of the at least one single diffusion break has a width of approximately g, and each of the first double diffusion break portion and the second double diffusion break portion has a width of approximately p/2, where p is greater than g.

5. The standard cell integrated circuit of claim 1, wherein each of the at least one single diffusion break, the first double diffusion break portion, and the second double diffusion break portion comprises a shallow trench isolation (STI) region.

6. The standard cell integrated circuit of claim 5, wherein a depth of each STI region of the first double diffusion break portion and the second double diffusion break portion is greater than a depth of each STI region of the at least one single diffusion break.

7. The standard cell integrated circuit of claim 1, wherein each of the first double diffusion break portion and the second double diffusion break portion is approximately half of a width of a full double diffusion break.

8. The standard cell integrated circuit of claim 1, wherein the plurality of pMOS transistors include a first subset of pMOS transistors and a second subset of pMOS transistors, the plurality of nMOS transistors include a first subset of nMOS transistors and a second subset of nMOS transistors, the first subset of pMOS transistors and the first subset of nMOS transistors provide first logic functionality, the second subset of pMOS transistors and the second subset of nMOS transistors provide second logic functionality, the first functionality and the second functionality are separated by an internal node, and one single diffusion break of the at the least one single diffusion break isolates diffusion regions for the first logic functionality and the second logic functionality at the internal node.

9. The standard cell integrated circuit of claim 8, wherein the first logic functionality outputs to the second logic functionality, the second logic functionality has an output node, and the output node is adjacent one of the first cell edge or the second cell edge.

10. A standard cell integrated circuit, comprising:
a plurality of p-type metal oxide semiconductor (MOS) (pMOS) transistors in a pMOS region of the standard cell integrated circuit, the pMOS region extending between a first cell edge and a second cell edge opposite the first cell edge;
a plurality of n-type MOS (nMOS) transistors in an nMOS region of the standard cell integrated circuit, the nMOS region extending between the first cell edge and the second cell edge,
a first means for isolating diffusion regions located in an interior region between the first cell edge and the second cell edge and extending across the pMOS region and the nMOS region, the first means for isolating diffusion regions being configured to separate the pMOS region into pMOS subregions and the nMOS region into nMOS subregions, a width of the first means for isolating diffusion regions being approximately g;
a second means for isolating diffusion regions extending at the first cell edge, a width of the second means for isolating diffusion regions being approximately p/2, p being greater than g; and
a third means for isolating diffusion regions extending at the second cell edge, a width of the third means for isolating diffusion regions being approximately p/2.

11. The standard cell integrated circuit of claim 10, wherein:
the first means for isolating diffusion regions is at least one single diffusion break located in the interior region between the first cell edge and the second cell edge and extending across the pMOS region and the nMOS region to separate the pMOS region into the pMOS subregions and the nMOS region into the nMOS subregions;
the second means for isolating diffusion regions is a first double diffusion break portion extending at the first cell edge; and
the third means for isolating diffusion regions is a second double diffusion break portion extending at the second cell edge.

12. The standard cell integrated circuit of claim 11, wherein the standard cell integrated circuit has n grids with pitch p between the grids, and a width of approximately n*p, the grids extending across the pMOS region and the nMOS region, and wherein:
each of the at least one single diffusion break extends along a different one of the n grids located in the interior region,
the first double diffusion break portion extends along the first cell edge between the first cell edge and a first grid located approximately p/2 from the first cell edge, and
the second double diffusion break portion extends along the second cell edge between the second cell edge and a second grid located approximately p/2 from the second cell edge.

13. The standard cell integrated circuit of claim 12, wherein gate interconnects for the pMOS transistors and the nMOS transistors extend along a subset of the n grids.

14. The standard cell integrated circuit of claim 13, wherein the gate interconnects have a width g.

15. The standard cell integrated circuit of claim 11, wherein each of the at least one single diffusion break, the first double diffusion break portion, and the second double diffusion break portion comprises a shallow trench isolation (STI) region.

16. The standard cell integrated circuit of claim 15, wherein a depth of each STI region of the first double diffusion break portion and the second double diffusion break portion is greater than a depth of each STI region of the at least one single diffusion break.

17. The standard cell integrated circuit of claim 11, wherein each of the first double diffusion break portion and the second double diffusion break portion is approximately half of a width of a full double diffusion break.

18. The standard cell integrated circuit of claim 11, wherein the plurality of pMOS transistors include a first subset of pMOS transistors and a second subset of pMOS transistors, the plurality of nMOS transistors include a first subset of nMOS transistors and a second subset of nMOS transistors, the first subset of pMOS transistors and the first subset of nMOS transistors provide first logic functionality, the second subset of pMOS transistors and the second subset of nMOS transistors provide second logic functionality, the first functionality and the second functionality are separated by an internal node, and one single diffusion break of the at the least one single diffusion break isolates diffusion regions for the first logic functionality and the second logic functionality at the internal node.

19. The standard cell integrated circuit of claim 18, wherein the first logic functionality outputs to the second logic functionality, the second logic functionality has an output node, and the output node is adjacent one of the first cell edge or the second cell edge.

20. A standard cell integrated circuit, comprising:
a plurality of p-type metal oxide semiconductor (MOS) (pMOS) transistors in a pMOS region of the standard cell integrated circuit, the pMOS region extending between a first cell edge and a second cell edge opposite the first cell edge;
a plurality of n-type MOS (nMOS) transistors in an nMOS region of the standard cell integrated circuit, the nMOS region extending between the first cell edge and the second cell edge,
wherein the standard cell integrated circuit includes:
means for providing at least one diffusion break located in an interior region between the first cell edge and the second cell edge and extending across the pMOS region and the nMOS region to separate the pMOS region into pMOS subregions and the nMOS region into nMOS subregions;
means for providing a first diffusion break portion extending at the first cell edge, the means for providing the first diffusion break portion having a greater depth than the means for providing the at least one diffusion break; and
means for providing a second diffusion break portion extending at the second cell edge, the means for providing the second diffusion break portion having a greater depth than the means for providing the at least one diffusion break.

21. The standard cell integrated circuit of claim 20, wherein the means for providing the at least one diffusion break comprises at least one single diffusion break, the means for providing the first diffusion break portion comprises a first double diffusion break portion, and the means for providing the second diffusion break portion comprises a second double diffusion break portion.

22. The standard cell integrated circuit of claim 21, wherein the standard cell integrated circuit has n grids with pitch p between the grids, and a width of approximately n*p, the grids extending across the pMOS region and the nMOS region, and wherein:
each of the at least one single diffusion break extends along a different one of the n grids located in the interior region,
the first double diffusion break portion extends along the first cell edge between the first cell edge and a first grid located approximately p/2 from the first cell edge, and
the second double diffusion break portion extends along the second cell edge between the second cell edge and a second grid located approximately p/2 from the second cell edge.

23. The standard cell integrated circuit of claim 22, wherein gate interconnects for the pMOS transistors and the nMOS transistors extend along a subset of the n grids.

24. The standard cell integrated circuit of claim 23, wherein the gate interconnects have a width g, each of the at least one single diffusion break has a width of approximately g, and each of the first double diffusion break portion and the second double diffusion break portion has a width of approximately p/2, where p is greater than g.

25. The standard cell integrated circuit of claim 21, wherein each of the at least one single diffusion break, the first double diffusion break portion, and the second double diffusion break portion comprises a shallow trench isolation (STI) region.

26. The standard cell integrated circuit of claim 25, wherein a depth of each STI region of the first double diffusion break portion and the second double diffusion break portion is greater than a depth of each STI region of the at least one single diffusion break.

27. The standard cell integrated circuit of claim 21, wherein each of the first double diffusion break portion and the second double diffusion break portion is approximately half of a width of a full double diffusion break.

28. The standard cell integrated circuit of claim 21, wherein the plurality of pMOS transistors include a first subset of pMOS transistors and a second subset of pMOS transistors, the plurality of nMOS transistors include a first subset of nMOS transistors and a second subset of nMOS transistors, the first subset of pMOS transistors and the first subset of nMOS transistors provide first logic functionality, the second subset of pMOS transistors and the second subset of nMOS transistors provide second logic functionality, the first functionality and the second functionality are separated by an internal node, and one single diffusion break of the at the least one single diffusion break isolates diffusion regions for the first logic functionality and the second logic functionality at the internal node.

29. The standard cell integrated circuit of claim 28, wherein the first logic functionality outputs to the second logic functionality, the second logic functionality has an output node, and the output node is adjacent one of the first cell edge or the second cell edge.

30. An operating method of a standard cell integrated circuit, comprising:
operating a plurality of p-type metal oxide semiconductor (MOS) (pMOS) transistors in a pMOS region of the standard cell integrated circuit, the pMOS region extending between a first cell edge and a second cell edge opposite the first cell edge;
operating a plurality of n-type MOS (nMOS) transistors in an nMOS region of the standard cell integrated circuit, the nMOS region extending between the first cell edge and the second cell edge,
wherein the standard cell integrated circuit includes:
at least one single diffusion break located in an interior region between the first cell edge and the second cell edge and extending across the pMOS region and the nMOS region to separate the pMOS region into pMOS subregions and the nMOS region into nMOS subregions;
a first double diffusion break portion extending at the first cell edge; and
a second double diffusion break portion extending at the second cell edge.

* * * * *